United States Patent [19]

Day et al.

[11] Patent Number: 4,532,893
[45] Date of Patent: Aug. 6, 1985

[54] ELECTRONICALLY CONTROLLED FUEL PUMP

[75] Inventors: Eric Day; Allen F. VanDerStuyf, both of Columbus, Ind.

[73] Assignee: Cummins Engine Company, Inc., Columbus, Ind.

[21] Appl. No.: 435,573

[22] Filed: Sep. 30, 1982

[51] Int. Cl.³ ............................................. F02M 41/02
[52] U.S. Cl. ................................. 123/41.31; 123/509; 165/51; 361/382
[58] Field of Search ................. 123/509, 41.31, 41.42; 165/41, 51; 361/382, 386, 388, 389

[56] References Cited

U.S. PATENT DOCUMENTS

| | | | |
|---|---|---|---|
| 3,965,971 | 6/1976 | Roggenkamp | 165/41 |
| 4,084,564 | 4/1978 | Rickert | 123/41.31 |
| 4,295,593 | 1/1981 | Stein | 165/51 |
| 4,364,355 | 12/1982 | Karino | 123/41.31 |

Primary Examiner—Carl S. Miller
Attorney, Agent, or Firm—Gary M. Gron; Robert T. Ruff

[57] ABSTRACT

The disclosure illustrates an electronically controlled fuel pump in which the microprocessor is cooled by the fuel extending to the inlet of a positive displacement pump. The cooling passage has a labyrinth flow path and the heat sinks of the microprocessor transfer heat to the passage through conduction. An auxiliary pump causes fuel to flow through the heat exchange passage during certain conditions, such as shutdown, to maintain the temperature of the microprocessor below a predetermined maximum. Transducers and other control elements associated with the microprocessor are maintained in a cavity in the fuel pump to protect them from the environment and a pivotal connection with appropriate placement of the leads is provided in the housing for ready access to these transducers and control elements.

11 Claims, 4 Drawing Figures

ELECTRONICALLY CONTROLLED FUEL PUMP

The present invention relates to fuel pumps and more specifically fuel pumps for internal combustion engines of the compression ignition type.

One of the fundamental requirements for a compression ignition (diesel) internal combustion engine is the provision of a fuel injection system that provides a precisely metered and quantity of fuel at the correct moment in the compression cycle to provide ignition of the resultant mixture. In the past, this control has been done using various forms of hydro-mechanical systems. One such system is the PT fuel system produced and manufactured by Cummins Engine Company, Inc. and disclosed in U.S. Pat. Nos. 2,727,503 and 2,749,897. In this system, a series of unit injectors are located at the cylinder head and are cam actuated to inject into the combustion chamber, quantities of fuel that have been metered into the injector as a function of the fuel pressure existing upstream of a fuel injector metering orifice. The system utilizes a fuel pump which provides the pressure at the injector to produce the metered quantity of fuel as a function of operator demand, engine rpm and manifold pressure.

The problem in a system of this type is that the control functions which are to be achieved by the fuel pump are closely tied together, thereby limiting flexibility. The control functions may be summarized as a sensing function, a computing function and an action function. In the hydro-mechanical system, the sensing function of, for example, rpm is done by a pair of flyweights on a rotatable shaft assembly and the flyweights also act to compute the force on a spool valve which provides the action to be taken, namely variably restricting fuel flow to achieve the desired pressure output. Such a system is cost effective but lacks the ability to utilize diverse parameter inputs to provide a most effective control of pressure to meet efficiency and emmission goals.

It has been proposed to use electronic modules and electronic computation systems to separate the function described above in order to achieve a more sophisticated level of control. Examples of such systems may be found in U.S. Pat. Nos. 4,108,115, 4,109,669 and 4,265,200. While these systems provide expanded ability to control and manipulate metered fuel they experience problems when they are exposed to the real life environment of a diesel engine, particularly when the unit is desired to be mounted directly to the engine. The diesel engine represents one of the most severe environments for a component in that the level of vibration, because of the higher compression pressures, is much greater and the diesel engine, because of its heavy duty nature, is operated under unusually brutal environmental conditions of heat, dirt and moisture. Under these conditions, the microprocessors contained in these units typically have mechanical failures due to vibration, moisture or excessive heat.

The above problems are solved in a fuel system for an internal combustion engine of the above type by a fuel pump which comprises a means for forming a housing and a means within the housing means and having an inlet for pressurizing fuel. Electronic control means are mounted within the housing for generating an electrical signal as a function of selected control inputs and a means is provided to define a passage for fuel through the housing means from an external source to the inlet of the pump means, and to the exterior of the housing at least a portion of the passage means being in heat transfer relation to the electronic control means whereby fuel is used to cool the electronic control means.

The above and other related features of the invention will be apparent from a reading of the following description of the disclosure shown in the accompanying drawings and the novelty thereof pointed out in the appended claims.

Figure 1:
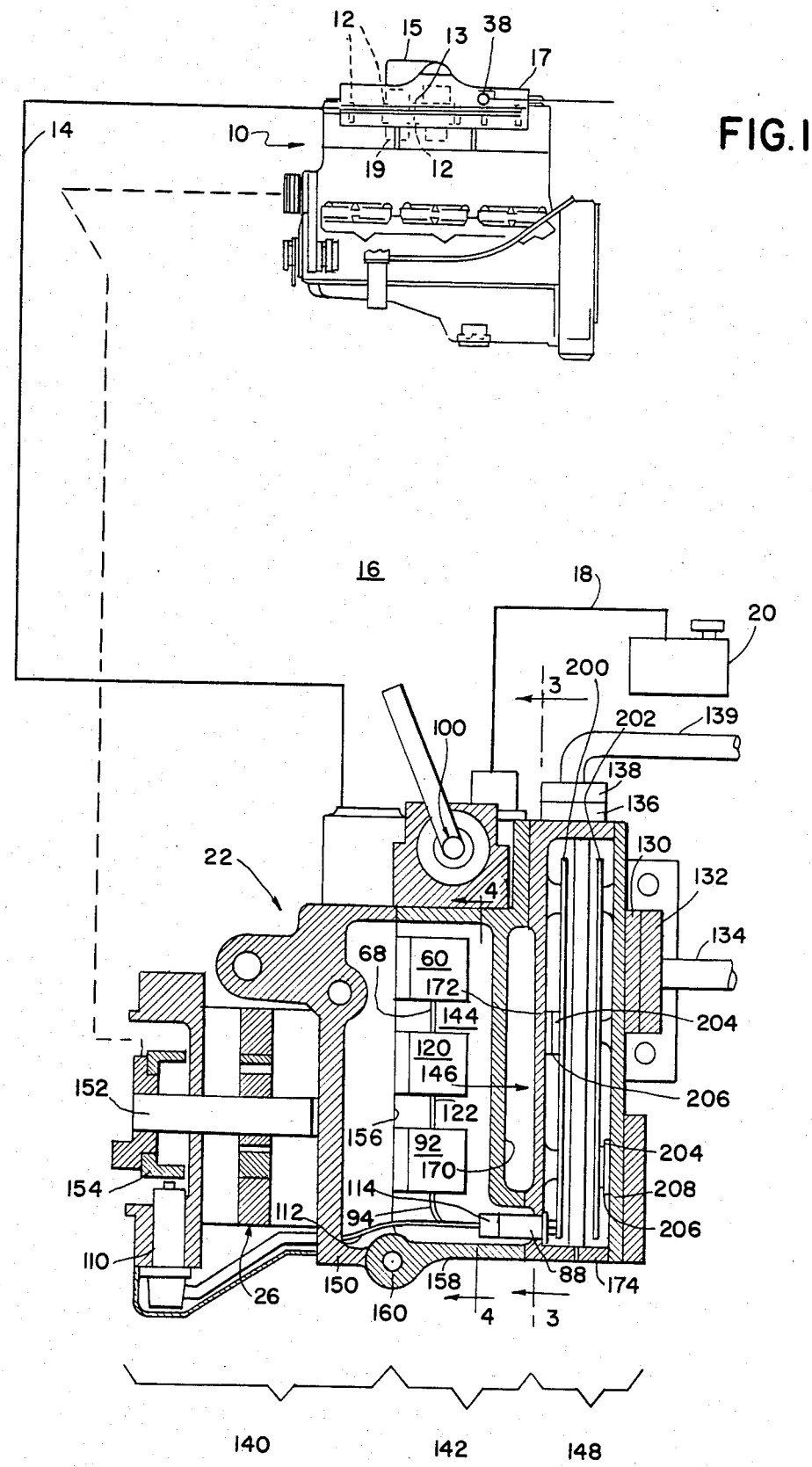
FIG. 1 is a sectional view of an electronic fuel pump embodying the present invention together with the internal combustion engine with which it is associated.

Referring to FIG. 1 there is shown a compression engine 10 with which the present invention is used. Since its principles of operation are well known, the complete details of engine 10 will not be covered to simplify the discussion of the present invention. For the present discussion it is enough to say engine 10 relies on the heat of compression of air to ignite fuel that is injected in timed sequence by fuel injectors 12. Injectors 12 are of the direct injection type in which a cam actuated plunger injects fuel at high pressure into the engine cylinders (not shown) for combustion.

The exhaust gases from the engine pass across the turbine of a turbocharger 13 which drives its compressor 19 to pressurize air for delivery through duct 15 to intake manifold 17. Injectors 12 receive fuel from a fuel system 16 via a distribution conduit 14. Fuel system 16 receives fuel from a supply line 18 and tank 20 and pressurizes it for delivery to conduit 14.

Figure 2:
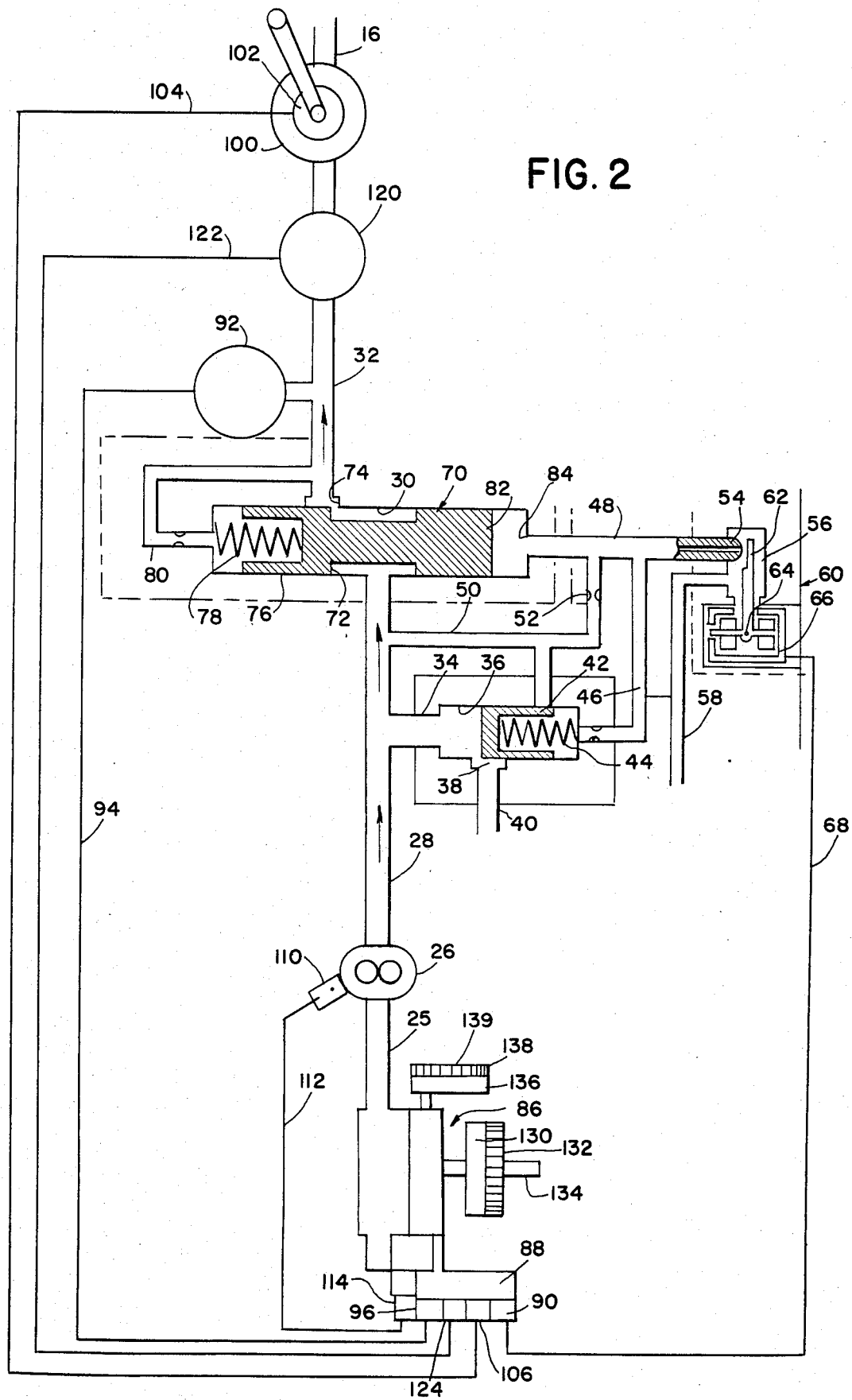
FIG. 2 is a schematic drawing of the hydraulic control system along with a schematic drawing of the electronic computation package.

The fuel system 16 comprises a fuel pump 22 which comprises a housing 24. In order to achieve a clearer understanding the function of the pump will be described in connection with the schematic showing of FIG. 2. The key elements of the system will be designated with the same numbers for FIGS. 1 and 2.

The fuel pump comprises an engine driven pump 26 which may be a gear pump or other positive displacement pump driven by the engine (note the mechanical connection thereto) and receiving fuel from a main supply passage. The output of the pump is discharged into a main passage 28 which extends through a throttling valve chamber 30 and an outlet passage 32 which connects with the line 16. A bypass passage 34 extends from the main passage 28 to a valve chamber 36 which has a port 38 connected to a drain line 40 extending to a lower pressure area and, if desired, to the fuel tank 20. A bypass valve element 42 is positioned in chamber 36 and is urged by a spring 44 in a direction which closes off bypass port 38. In addition, a passage 46 extends to a control pressure passage 48.

Control pressure passage 48 is connected to the main passage 28 by a passage 50 having an orifice 52 of predetermined size which limits the amount of flow that can pass into control passage 48. Passage 48 extends to an orifice 54 which discharges into a chamber 56 connected via a drain line 58 to a lower pressure source which may be the tank 20. An electro hydraulic valve 60 is positioned to have a valve element 62 closely adjacent the orifice 54 so that movement of valve 62 relative to orifice 54 provides the variable opening. Valve element 62 is connected to a armature 64 positioned within an electromagnet 66 which receives current input signals via line 68 to control the effective area of orifice 54 as a function of an electrical input signal. While many different valves may be employed for this purpose, the electromagnetic valve manufactured by Moog, Inc. of East Aurora, N.Y. 14052 achieves satisfactory results.

A spool valve 70 is contained within chamber 30 for longitudinal movement and has a land 72 which cooperates with an outlet port 74 to provide a variable restriction to flow into passage 32 as a function of the displacement of spool valve 70. A first end 76 of spool valve 70 is acted on by a spring 78 in a direction to increase the restriction to flow at port 74. In addition, a passage 80 connects with passage 32 to apply the pressure existing in passage 32 to the first end 76 of spool valve 70 to also act in a direction increasing the restriction to flow. A second end 82 of spool valve 70 is connected via port 84 to the control pressure passage 48 so that the control pressure existing in passage 48 acts in a direction which decreases the restriction to flow past port 74.

The electro-hydraulic valve 60 functions to variably restrict flow out of orifice 54 and thus establish a control pressure which is utilized to establish an output pressure to make the system function in a manner to be described later. The signal in line 68 is fed to the electro-hydraulic valve by a microprocessor circuit generally indicated at 86 via a connector 88 having a first portion directly connected to the microprocessor 86 and a second portion 90 connected to line 68.

The microprocessor 86 receives additional electrical control inputs. For example, an output fuel pump pressure transducer 92 senses the pressure in passage 32 and generates a signal via line 94 which extends to connector 96 and then to microprocessor 86 via connector 88. In addition, an operator manipulated throttle valve 100 addition downstream of line 32 has its position factored into the control by a transducer 102 connected to the throttle which generates an electrical signal via line 104 and connector 106 through connector 88 to the microprocessor 86. A further control input signal is generated by a magnetic speed sensor 110 which typically senses passage of a coupling in the input to the pump 26 and generates a signal via line 112 which extends to connector 114 on connector 88.

In order to positively terminate flow to the injectors 12 an electrically actuated solenoid shutdown valve 120 is provided in line 32. This valve 120 receives a control input via line 122 from connector 124 which in turn connects to one portion of connector 88.

Additional control inputs may be employed to make the microprocessor 86 take different operating parameters into account for its control function. These parameters may be generated on the internal combustion engine or they may be generated in connection with the vehicle powered by the engine. For engine mounted sensors and transducers, a connector 130 is electrically connected to microprocessor 86 and has various connectors 132 which include lines 134 extending to various transducers and control elements. For vehicle interconnections a connector 136 is directly electrically connected to microprocessor 86 and includes corresponding connector 138 leading to a wire or harness 139 interconnected with various vehicle components.

Figure 3:
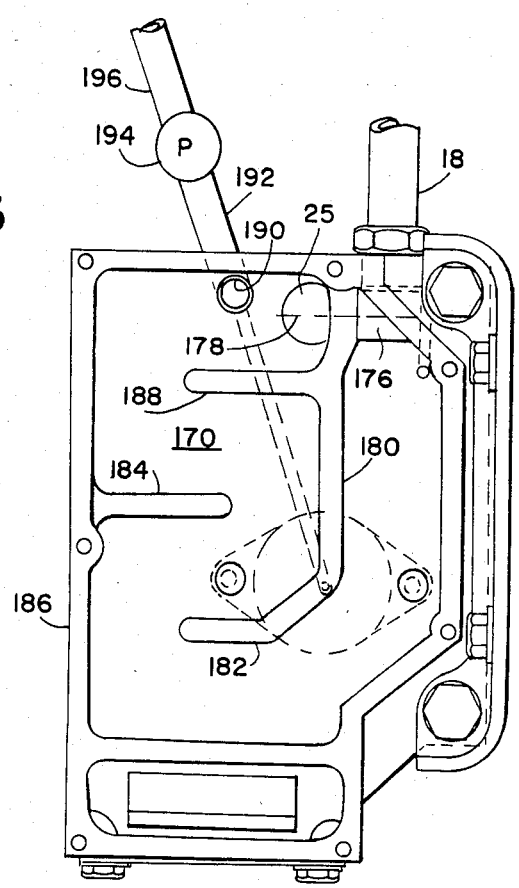
FIG. 3 is a cross-sectional view of the fuel pump of FIG. 1 taken on lines 3—3 of FIG. 1.
Figure 4:
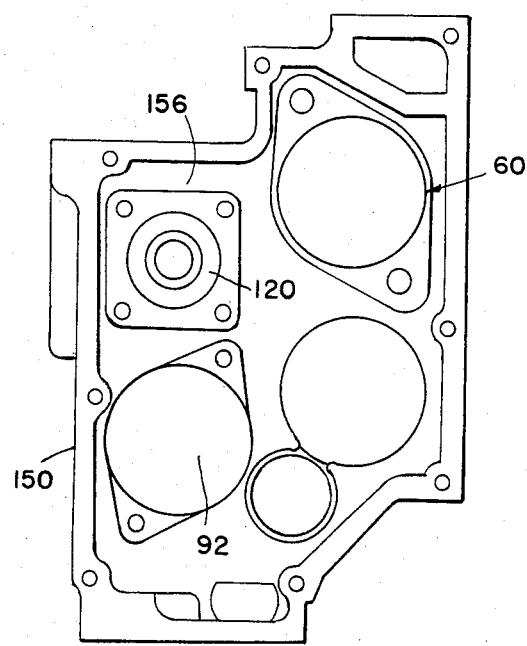
FIG. 4 is another cross-sectional view of the fuel pump of FIG. 1 taken on lines 4—4 of FIG. 1.

Referring back now to FIG. 1 and to FIGS. 3 and 4, the pump housing 24 is comprised of a series of zones which provide for a more efficient arrangement of the component and a more ready access for maintenance.

A first zone 140 includes the supply pump 26 and associated electro-hydraulic transducers and control elements. A second zone 142 comprises a cavity 144 in which the various transducers and control elements are positioned and a heat transfer passage 146 to be described later.

A third zone 148 comprises the microprocessor 86 and associated electrical connectors.

The first zone 140 comprises a housing element 150 in which the pump 26 is housed. The input shaft 152 for the pump has a coupling 154 whose motion past the magnetic sensor 110 provides the rpm input.

As described earlier, the housing 150 also contains the various hydraulic control elements including the electrohydraulic valve 60 which is mounted on an end wall 156 of housing 150 and the pressure sensor 92 is also mounted on the end wall 156. In addition, the shutdown valve 120 is conveniently located on the same end wall 156 (see FIG. 4). The second zone 142 comprises a housing 158 which surrounds the cavity 144. As is apparent from FIG. 1, the various transducers and control elements are positioned within cavity 144 so that they are protected from moisture and other adverse elements of the environment. In order to gain access to the transducers for replacement, repair or adjustment, housings 150 and 158 are pivotally connected at 160. The housings are held in the illustrated position by suitable detachable connectors (not shown).

In order that the flexible lines which connect the various elements to the connector 88 of microprocessor 86 do not experience a change in length when the housings are pivoted to expose the transducers, the lines 112, 68, 122 and 94 are positioned closely adjacent the pivot point.

Housing 158 also contains the cooling passage 146 more particularly illustrated in FIG. 3. The heat transfer passage 146 comprises a first wall element 170 integral with housing 158 and a second wall element 172 integral with housing 174 for zone 148. The walls 170 and 172 are opposed and spaced from one another and, with particular reference to FIG. 3, an inlet port 176 in end wall 170 connects with inlet passage 18 and an outlet port 178 connects with main fuel pump supply passage 25.

The fuel flowing from the inlet to the outlet port is made to travel a tortuous path by a barrier which bridges a substantial portion of the space between the walls and which comprises a longitudinal straight section 180 extending from a point in between ports 176 and 78 and to a remote point adjacent the other end of the wall where a bend section 182 causes the fuel to be diverted generally at a right angle to the longitudinal barrier 180. An additional barrier 184 integral with a perimeter wall 186 extends generally laterally with respect to longitudinal barrier 180 to cause the fuel to achieve an "s" shape pattern. Another lateral barrier element 188 extends from the longitudinal barrier 180 at a point adjacent the outlet port to force a final change of direction before the fuel exits through port 25 and into the inlet of the pump.

An auxiliary outlet passage 190 in wall 170 adjacent outlet port 178 connects with a passage 192 leading to an electrically actuated auxiliary pump 194 which discharges its output by a line 196 to a suitable drain, preferably the fuel tank 20. The pump 194 is thermostatically actuated and responds to a temperature sensor (not shown) in the microprocessor 86 to begin pumping whenever the temperature exceeds a predetermined maximum.

The final zone in the pump is 148 which comprises the housing 174 in which a pair of circuit boards 200,202 are positioned. Circuit boards 200,202 comprise various electronic control elements including power generating elements 204. These power generating elements 204 have integral heat sinks 206 associated therewith to dissipate the heat generated by them. These heat sink elements are structurally connected to the wall 172 which is heat conductive and to a cover 208 which is also heat conductive. As a result, a direct path for heat by conduction is provided from the power generating elements 204 to the respective heat conductive walls. Since wall 172 is exposed on one side to the fuel flowing by it effectively takes the heat away from the circuit boards. The circuit boards are maintained in place and protected from vibration by a suitable potting material (not shown). The connectors referred to before are directly connected to the circuit boards 200,204 and have their interface extending through the wall of housing 174 to provide convenient connection to the exterior.

During operation of the fuel system described above the pump 26 is driven to pressurize fuel and pull it from main supply conduit 25 past the heat exchange assembly 146 to thus provide a cooling function for the microprocessors 86. It is noted that the fuel temperature, in most cases, is maintained below 150° F. which is well within the environmental limits of the microprocessor. The flow that passes from the pump is bypassed by the valve element 42 to maintain a pressure which is a fixed differential above the pressure existing in line 48. This fixed differential is generally established by the spring constant of spring 44.

The regulated pressure in line 28 is essentially re-regulated by throttling past the spool valve 30. This spool valve maintains the pressure downstream of it at a fixed differential below the pressure existing in line 48. In a similar fashion the spring constant of spring 78 establishes the amount of the pressure differential.

Thus we see that the pressures both relate to the control pressure in line 48. Because of the orifice 52, the flow into passage 48 is limited and since the wide open area of orifice 54 is greater than orifice 52, a pressure that is lower than in the line 28 can be established in passage 48. This pressure therefore is manipulated up or down to meet requirements set by the microprocessor 86. The output pressure in line 32 therefore is at the appropriate pressure for use by the injectors. The pressure head against which the pump 26 must act is only a predetermined level above the control pressure. Since the duty cycle of an engine requires pressure generally below the maximum obtainable pressure, it can be seen that the overall pressure to which the pump is subjected is substantially reduced.

During shutdown there are conditions when the engine experiences greatly elevated temperatures, for example, after a heavy duty operating cycle during a hot ambient day. In this case temperatures can go over 200°. Whenever a temperature of a predetermined maximum, for example 180°, in the microprocessor is exceeded, the auxiliary pump 194 is actuated to discharge fuel from the cooling assembly 146 adjacent the outlet port 178. This causes fuel to be drawn into the inlet port 18 and through the heat exchanged passage and back to the tank thus cooling the microprocessor and maintaining its temperature at an acceptable level.

The circuit boards forming the basic part of the microprocessor are connected in place through the heat sink elements and the connectors in order to achieve a sturdy mounting and protect them from vibration. In addition, the direct connection through the heat sinks enhances the heat flow to the heat exchanged portion.

The accessibility of the transducers and other elements that would require periodic maintenance, replacement or adjustments is enhanced by the pivotal connection and the placement of the lines so as to minimize the stress placed on them during this operation.

While the invention has been described in connection with a preferred embodiment it should be apparent to those skilled in the art that it may be practiced in forms other than those specifically described without departing from its spirit and scope.

Having thus described the invention, what is claimed as novel and desired to be secured by Letters Patent of the United States is:

1. In a fuel system for an internal combustion engine having injectors which meter fuel to said engine, a fuel pump comprising:
   means for forming a housing;
   engine driven pump means within said housing means, and having an inlet, for pressurizing fuel;
   electronic control means mounted within said housing for generating an electrical signal as a function of selected control inputs, and
   means for providing a passage for fuel through said housing from an external source to the inlet of said pump means and to the exterior of said housing, at least a portion of said passage means being in heat transfer relation to said electronic control means whereby fuel is used to cool said electronic control means and auxiliary pump means connected to said passage means for pressurizing fuel for establishing a flow of fuel through said passage means and means for actuating said auxiliary pump means whenever a selected temperature in said housing means exceeds a predetermined limit above the temperature that occurs during operation of said engine driven pump means irrespective of operation of said engine driven pump means.

2. Apparatus as in claim 1 wherein said passage has a tortuous path in heat transfer relation to said electronic control means.

3. Apparatus as in claim 1 wherein:
   said electronic control means includes circuit means mounted on a planar sheet;
   said passage means comprise a passage formed in said housing extending in heat transfer relation thereto adjacent one face of said planar sheet.

4. Apparatus as in claim 3 wherein said passage has a tortuous path.

5. Apparatus as in claim 4 wherein:
   said passage comprises a pair of spaced opposed wall elements enclosed by a perimeter wall, one of which is adjacent and generally parallel to said planar sheet, one of said walls having an inlet and outlet adjacent one another, and means forming a barrier substantially between the wall elements and extending from between the inlet and outlet ports to a point remote from said points thereby forming said tortuous path.

6. Apparatus as in claim 5 wherein:

said barrier means has a generally straight elongated section extending from said outlets and an integral bend remote from the outlets around which fuel must pass, said barrier means further comprising a pair of generally straight sections extending laterally with respect to said straight section, one of said lateral sections extending from said elongated section and the other from the perimeter wall.

7. Apparatus as in claim 1 wherein:

said electronic control means includes circuit means having certain power consuming elements which generate heat and said power consuming elements having a heat sink associated therewith;

said passage means being defined in part by a wall of heat conductive material in said housing, said heat sinks being mounted in abutting relationship to said wall for heat transfer to said wall by conduction.

8. Apparatus as in claim 1 wherein said auxiliary pump means is electrically actuatable and said electronic control means includes means for connecting a source of electrical power to said auxiliary pump means whenever said temperature exceeds said limit.

9. In a fuel system for an internal combustion engine having injectors which meter fuel to said engine, a fuel pump comprising:

means for forming a housing;

pump means in a first zone within said housing means, and having an inlet, for pressurizing fuel;

electronic control means comprising circuit means mounted on a planar circuit board in a third zone within said housing means and transducers and other control elements for sensing and controlling selected operating parameters and mounted in said first zone, said electronic control means generating an electrical signal as a function of selected control inputs, and means for providing a passage for fuel through said housing from an external source to the inlet of said pump means in a second zone of said housing between the first and third zones, at least a portion of said passage means being in heat transfer relation to said electronic control means whereby fuel is used to cool said electronic control means, said second zone including a cavity in which said transducers and control elements are received, said second zone being pivotally mounted to said first zone whereby access may be had to said transducers and other control elements.

10. Apparatus as in claim 9 wherein said transducers and said control means are interconnected with said circuit means through flexible electrically conductive wire, said wires extending between said first and third zones closely adjacent said pivot point so that the effective lengths of said wires do not change when the zones are pivoted with respect to one another.

11. Apparatus as in claim 9 wherein:

said electronic control means includes transducers and other control elements for sensing and controlling selected operating parameters;

said transducers and other control elements including flexible conductive wires for interconnection with said circuit means;

said electronic control means further comprises releasable connector means, one portion of which is electrically and structurally connected to said circuit board and extending from said circuit board so that the interface with the other portion of said connector means is at the junction of the second and third zones and at the exterior of the housing means in the second zone.

* * * * *